United States Patent
Kim et al.

(10) Patent No.: US 7,122,407 B2
(45) Date of Patent: Oct. 17, 2006

(54) METHOD FOR FABRICATING WINDOW BALL GRID ARRAY SEMICONDUCTOR PACKAGE

(75) Inventors: Sung-Jin Kim, Hsin-Chu (TW); Chih-Horng Horng, Hsin-Chu (TW); Ming-Sung Tsai, Hsin-Chu (TW); Chung-Ta Yang, Hsin-Chu (TW)

(73) Assignee: Ultra Tera Corporation, Hsin-chu (TW)

( * ) Notice: Subject to any disclaimer, the term of this patent is extended or adjusted under 35 U.S.C. 154(b) by 231 days.

(21) Appl. No.: 10/923,748

(22) Filed: Aug. 24, 2004

(65) Prior Publication Data

US 2005/0208707 A1   Sep. 22, 2005

(30) Foreign Application Priority Data

Mar. 18, 2004   (TW) .............................. 93107246 A

(51) Int. Cl.
*H01L 21/44* (2006.01)
(52) U.S. Cl. .................. 438/127; 257/E21.502
(58) Field of Classification Search .................. 438/127
See application file for complete search history.

(56) References Cited

U.S. PATENT DOCUMENTS

2005/0062152 A1* 3/2005 Tsai ........................ 257/737
2005/0062155 A1* 3/2005 Tsai ........................ 257/738

* cited by examiner

*Primary Examiner*—W. David Coleman
(74) *Attorney, Agent, or Firm*—Clark & Brody; William F. Nixon

(57) ABSTRACT

A method for fabricating a window ball grid array (WBGA) semiconductor package is provided. A substrate is prepared having a through opening and ball pads on a lower surface thereof. A chip is mounted over the opening of the substrate via an adhesive, with gaps not applied with the adhesive left between the chip and substrate. The chip is electrically connected to the substrate via bonding wires through the opening. A spacer is attached to the lower surface of the substrate and has a through hole and a recessed portion around the through hole. During molding, the spacer is clamped between the substrate and a mold, and the recessed portion is located between the ball pads and the opening, such that a resin material for forming an encapsulation body encapsulates the chip and flows through the gaps to encapsulate the bonding wires. The recessed portion holds resin flash therein.

11 Claims, 7 Drawing Sheets

METHOD FOR FABRICATING WINDOW BALL GRID ARRAY SEMICONDUCTOR PACKAGE

FIELD OF THE INVENTION

The present invention relates to fabrication methods of semiconductor packages, and more particularly, to a method for fabricating a window ball grid array (WBGA) semiconductor package having a chip mounted over an opening formed through a substrate and electrically connected to the substrate via bonding wires going through the opening.

BACKGROUND OF THE INVENTION

A window ball grid array (WBGA) package utilizes a substrate having a through opening where electrically-connecting bonding wires are received so as to reduce the package size. FIGS. 2A–2F show the procedural steps of a fabrication method of the WBGA semiconductor package. As shown in FIG. 2A (cross-sectional view) and FIG. 2B (top view), once the substrate 10 having the through opening 102 is prepared, at least one semiconductor chip 11 is mounted on an upper surface 100 of the substrate 10 and over the opening 102 by means of an adhesive 12. The adhesive 12 is usually applied along two relatively longer sides of the opening 102, with gaps G along two relatively shorter sides of the opening 102 formed between the chip 11 and the substrate 10 and not applied with the adhesive 12. A plurality of bonding wires 13 are formed through the opening 102 to electrically connect the chip 11 to a lower surface 101 of the substrate 10.

As shown in FIGS. 2C and 2D, the substrate 10 with the chip 11 and the bonding wires 13 is placed and clamped between an upper mold 17 and a lower mold 18 of an encapsulation mold, wherein the chip 11 is received in an upwardly recessed cavity 170 of the upper mold 17, and the bonding wires 13 are received in a downwardly recessed cavity 180 of the lower mold 18. A first molding process is performed to inject a conventional resin material (such as epoxy resin) into the downwardly recessed cavity 180 of the lower mold 18 to form a lower encapsulation body 15 for filling the opening 102 and encapsulating the bonding wires 13; however, the gaps G between the chip 11 and the substrate 10 usually can not be completely filled by the resin material.

Then as shown in FIG. 2E, a second molding process is performed to inject the resin material into the upwardly recessed cavity 170 of the upper mold 17 to form an upper encapsulation body 14 for encapsulating the chip 11.

After the first and second molding processes are complete, the upper and lower molds 17, 18 are removed from the substrate 10, such that area on the lower surface 101 of the substrate 10 not covered by the lower encapsulation bodies 15, such as ball pads 103, can be exposed outside. Finally as shown FIG. 2F, a plurality of solder balls 16 are bonded to the exposed ball pads 103 on the lower surface 101 of the substrate 10, and the WBGA semiconductor package is fabricated.

However, the above package fabrication method leads to significant drawbacks. First, the downwardly recessed cavity of the lower mold needs to be sized in accordance with the size of the substrate opening to allow the lower encapsulation body to completely cover the opening but not occupy area or ball pads on the lower surface of the substrate. Therefore, when using substrates having openings of different sizes, new lower molds having correspondingly-dimensioned downwardly recessed cavities are required, making the fabrication cost undesirably increased. Moreover, two-stage encapsulation is required, including the first molding process and the second molding process. This two-stage encapsulation process not only complicates the fabrication performance but also leads to a resin-flash problem. During the first encapsulation process for forming the lower encapsulation body, area on the lower surface of the substrate around the opening and underneath the chip usually lacks firm support from the upper mold and is not strongly clamped by the encapsulation mold, such that the resin material injected into the downwardly recessed cavity of the lower mold may easily leak or flash through the interface between the lower mold and the substrate to unintended area the lower surface of the substrate. If the ball pads are contaminated by the resin flash, they can not be well bonded to solder balls, thereby degrading reliability of the semiconductor package. Besides, since the gaps between the chip and the substrate are usually not completely filled by the resin material, voids in the gaps undesirably cause popcorn effect and damage the package structure.

In order to solve the above problems, another fabrication method of a WBGA package is proposed in a U.S. patent application filed on Sep. 24, 2003 by the present applicant. As shown in FIG. 3, after the above substrate 10 is formed with the chip 11 and bonding wires 13, a spacer 19 is attached to the lower surface 101 of the substrate 10. A through hole 190 is formed through the spacer 19 corresponding to the opening 102 of the substrate 10 and accommodates wire loops of the bonding wires 13. A single molding process is performed. The substrate 10 and the spacer 19 are clamped between the upper mold 17 and a lower mold 18' having a flat top surface 181 in contact with the spacer 19. The resin material is injected into the upwardly recessed cavity 170 for encapsulating the chip 11 and also flows through the gaps (not shown) between the chip 11 and the substrate 10 to the opening 102 and the through hole 190 so as to encapsulate the bonding wires 13 and fill the opening 102, through hole 190 and gaps (not shown). The molds 17, 18' and the spacer 19 are removed from the substrate 10 after molding, such that the chip 11 and bonding wires 13 are encapsulated by an integral encapsulation body 1.

The above fabrication method beneficially utilizes the spacer. The spacer is cost-effective to fabricate and can be formed with variously-sized through hole in accordance with the substrate opening without significantly increasing the fabrication cost. The gaps between the chip and the substrate are completely filled with the resin material, thereby not producing voids or popcorn effect. The chip and bonding wires are encapsulated by an integral encapsulation body formed by a single molding process, not complicating the fabrication performance. And the spacer clamped between the substrate and the lower mold supports area the lower surface of the substrate conventionally lacking firm support from the upper mold and thus helps eliminate the above resin flash through the interface between the lower mold and the substrate. However, the resin flash may still possibly or accidentally occur through the interface between the spacer and the substrate and contaminates unintended area such as ball pads on the lower surface of the substrate.

Therefore, the problem to be solved herein is to provide a fabrication method of WBGA semiconductor package to effectively solve the resin-flash problem.

SUMMARY OF THE INVENTION

A primary objective of the present invention is to provide a method for fabricating a window ball grid array (WBGA) semiconductor package, in the use of a spacer having through holes corresponding to substrate openings and having recessed portions for receiving resin flash, so as to assure ball pads on the substrate to be free of contamination of resin flash.

Another objective of the invention is to provide a method for fabricating a WBGA semiconductor package, in the use of a spacer that can be formed with variously-sized through holes corresponding to various openings of substrates, which spacer is cost effective to fabricate thereby not increasing the fabrication cost.

A further objective of the invention is to provide a method for fabricating a WBGA semiconductor package, in the use of an integral encapsulation body to encapsulate the chip and bonding wires, thereby enhancing mechanical strength of the semiconductor package.

In accordance with the foregoing and other objectives, the method for fabricating a WBGA semiconductor package proposed by the present invention comprises the steps of: preparing a substrate plate integrally formed of a plurality of substrates each of which has an upper surface and an opposite lower surface and has an opening formed through the same, wherein at least one array of ball pads are formed on the lower surface of each of the substrate around the opening and spaced apart from the edge of the opening; mounting at least one chip on the upper surface and over the opening of each of the substrates via an adhesive, with gaps, not applied with the adhesive, being formed between the chips and the corresponding substrates; forming a plurality of bonding wires through the opening of each of the substrates for electrically connecting the chip to the lower surface of the corresponding substrate; preparing a spacer having an upper surface and an opposite lower surface and having a plurality of through holes through the same, with a recessed portion formed on the upper surface of the spacer around each of the through holes; and attaching the upper surface of the spacer to the lower surfaces of the substrates, wherein each of the through holes corresponds to and is larger than the opening of each of the substrate, and the recessed portion is located between the array of ball pads and the edge of the opening, and wherein the spacer has a thickness larger than a height of wire loops of the bonding wires protruding from the lower surfaces of the substrates so as to allow the bonding wires bonded to each of the chips to be received in the corresponding through hole of the spacer and the opening of the corresponding substrate; performing a molding process which uses an upper mold having a cavity and a lower mold to form an encapsulation body by a resin material on the upper and lower surfaces of the substrates, wherein the upper mold is mounted on the upper surfaces of the substrates with the chips received in the cavity, and the lower mold is attached to the lower surface of the spacer with the spacer disposed between the substrates and the lower mold, so as to allow the resin material to fill the cavity for encapsulating the chips and flow through the gaps between the chips and the corresponding substrates for filling the openings of the substrates, the through holes of the spacer and the gaps and encapsulating the bonding wires; removing the upper and lower molds and the spacer from the substrates; bonding a plurality of solder balls to the ball pads on the lower surface of each of the substrates; and cutting part of the encapsulation body formed on the upper surfaces of the substrates and the substrate plate to separate apart the integrally formed substrates and form a plurality of individual semiconductor packages each having a singulated substrate.

It is a characteristic feature of utilizing a spacer having through holes sized in accordance with openings of the substrates and formed with recessed portions respectively around the through holes. During molding, the spacer is strongly clamped between the substrate and the lower mold, with the recessed portions located between the ball pads on the substrate and the edge of the openings, and the gaps between the chips and substrates and along shorter sides of the substrate openings serve as passages for the resin material to form the encapsulation body on the substrates. Besides encapsulating the chips, the resin material flows through the gaps to encapsulate the bonding wires and fill the substrate openings, the through holes of the spacer and also the gaps. The strong clamping of the spacer helps prevent flash of the resin material to the interface between the spacer and the substrate. Once if the resin material accidentally leaks or flashes through the interface between the spacer and the substrate, it would be received and held in the recessed portions of the spacer without further flash or leakage out of the recessed portions. As a result, the ball pads on the substrate are free of contamination from resin flash and can be completely exposed for bonding the solder balls. Moreover, the spacer is cheaply fabricated, such that when using substrates having openings of different sizes, spacers formed with correspondingly-sized through holes can be used without significantly increasing the fabrication costs. As such, the flat lower mold having a flat top surface in contact with the spacer is universal for use with various substrates in accompany with appropriate spacers. Furthermore, the integral encapsulation body that encapsulates the chip and bonding wires can desirably enhance the mechanical strength of the semiconductor package.

BRIEF DESCRIPTION OF THE DRAWINGS

The present invention can be more fully understood by reading the following detailed description of the preferred embodiments, with reference made to the accompanying drawings, wherein:

FIGS. 1A–1I are schematic diagrams showing procedural steps for fabricating a semiconductor package according to the present invention, wherein FIG. 1F is a cross-sectional view of FIG. 1E taken along line 1F—1F;

FIGS. 2A–2F (PRIOR ART) are schematic diagrams showing procedural steps of a fabrication method of a WBGA semiconductor package, wherein FIG. 2D is a cross-sectional view of FIG. 2C taken along line 2D—2D.

DETAILED DESCRIPTION OF THE PREFERRED EMBODIMENTS

The procedural steps of a method for fabricating a window ball grid array (WBGA) semiconductor package according to the present invention are described in detail with reference to FIGS. 1A–1I.

Figure 1A:
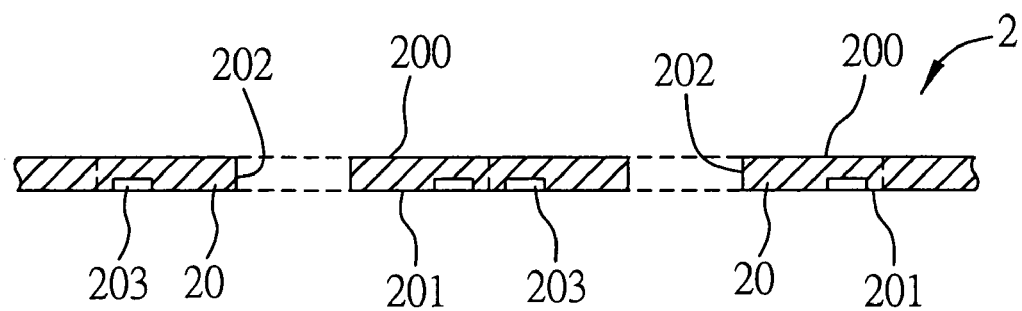

Referring to FIG. 1A, the first step is to prepare a substrate plate 2 integrally formed of a plurality of substrates 20, which can be made of a conventional resin material such as epoxy resin, polyimide resin, BT (bismaleimide triazine) resin, FR4 resin, etc. Each of the substrates 20 has an upper surface 200 and an opposite lower surface 201 and is formed with an opening 202 penetrating through the same, wherein the opening 202 preferably has a rectangular shape having two opposite longer sides and two opposite shorter sides. At least one array of ball pads 203 are formed on the lower surface 201 of each of the substrates 20 around the opening 202 and spaced apart from the edge of the opening 202. Fabrication of the substrate plate 2 employs conventional technology and is not to be further detailed herein.

Figure 1B:
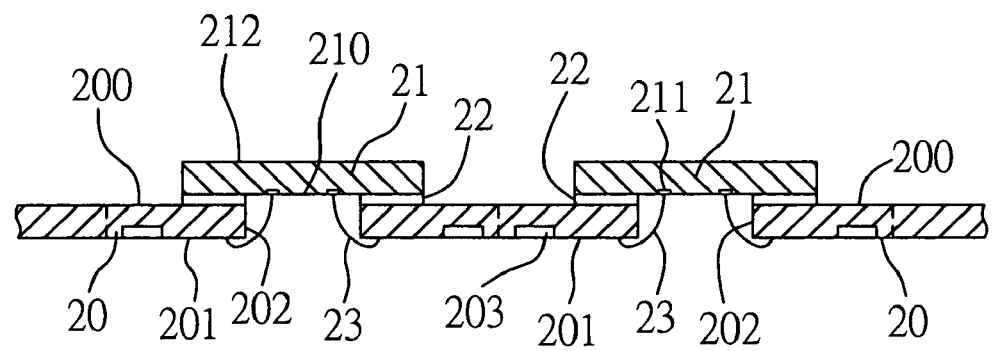
Figure 1C:
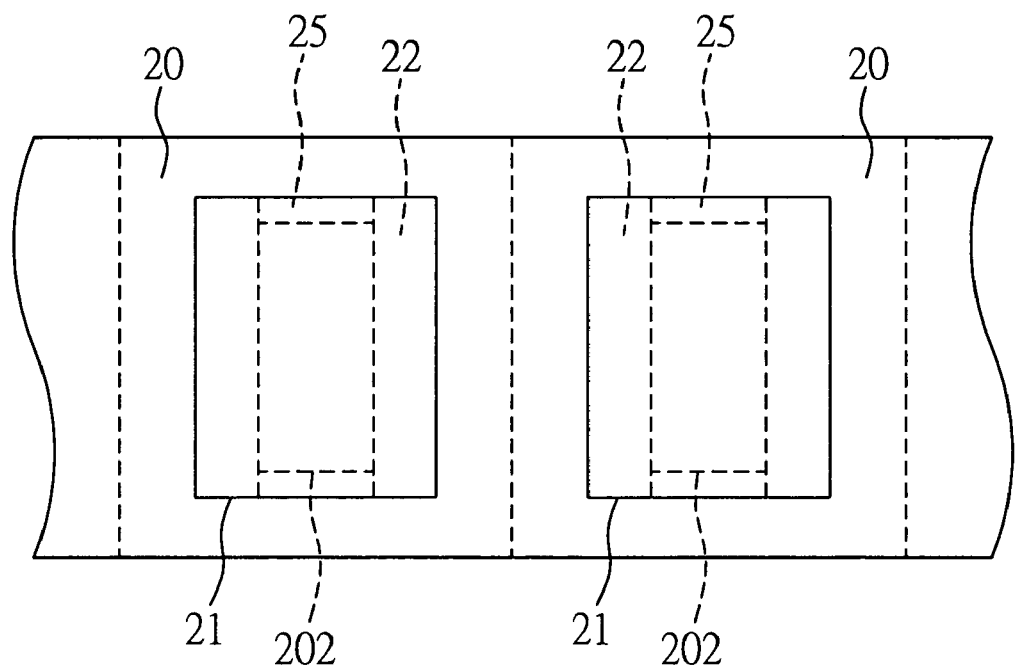

Referring to FIG. 1B (cross-sectional view) and FIG. 1C (top view), the next step is to mount at least one semiconductor chip 21 on the upper surface 200 and over the opening 202 of each of the substrates 20 via an adhesive 22. The chip 21 has an active surface 210 where a plurality of electronic circuits (not shown) and bond pads 211 are formed, and an opposite inactive surface 212. The chip 21 is sized larger in surface area than the opening 202 of the corresponding substrate 20 to entirely cover the opening 202. The chip 21 is mounted in a face-down manner on the corresponding substrate 20 that the active surface 210 faces the opening 202 and is attached to the upper surface 200 of the corresponding substrate 20 by means of the adhesive 22 which is applied between the chip 21 and the substrate 20 and usually along the two longer sides of the opening 202, leaving gaps 25 not applied with the adhesive 22 to be formed between the chip 21 and the substrate 20 and along the two shorter sides of the opening 202. The adhesive 22 is applied in a predetermined thickness, making the gaps 25 between the chip 21 and the substrate 20 have a height equal to the thickness of the adhesive 22, which thickness or height is predetermined to allow particles of a resin material subsequently used for forming an encapsulation body (not shown) to be able to smoothly pass through the gaps 25.

Then, a wire-bonding process is carried out to form a plurality of bonding wires 23 through the opening 202 of each of the substrates 20, wherein the bonding wires 23 are bonded to the bond pads 211 on the chip 21 and to the lower surface 201 of the corresponding substrate 20 so as to electrically connect the chip 21 to the substrate 20. The bonding wires 23 can be made of gold. The wire-bonding process pertains to conventional technology and is not to be further described herein.

Figure 1D:
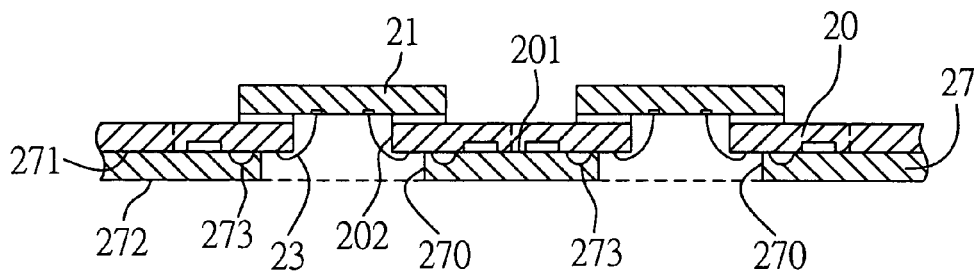

Referring to FIG. 1D, a spacer 27, preferably made of a rigid material, is prepared having a plurality of through holes 270 penetrating through the same and having an upper surface 271 and an opposite lower surface 272. A recessed portion 273 is formed on the upper surface 271 of the spacer 27 around each of the through holes 270. The upper surface 271 of the spacer 27 is attached to the lower surfaces 201 of the substrates 20, wherein each of the through holes 270 corresponds to and is larger than the opening 202 of each of the substrates 20, and the recessed portion 273 is located between the array of ball pads 203 and the edge of the opening 202. The spacer 27 is sized in thickness larger than a height of wire loops of the bonding wires 23 protruding from the lower surfaces 201 of the substrates 20, so as to allow the wire loops of the bonding wires 23 bonded to each of the chips 21 to be received in the corresponding through hole 270 of the spacer 27 and the opening 202 of the corresponding substrate 20.

Figure 1E:
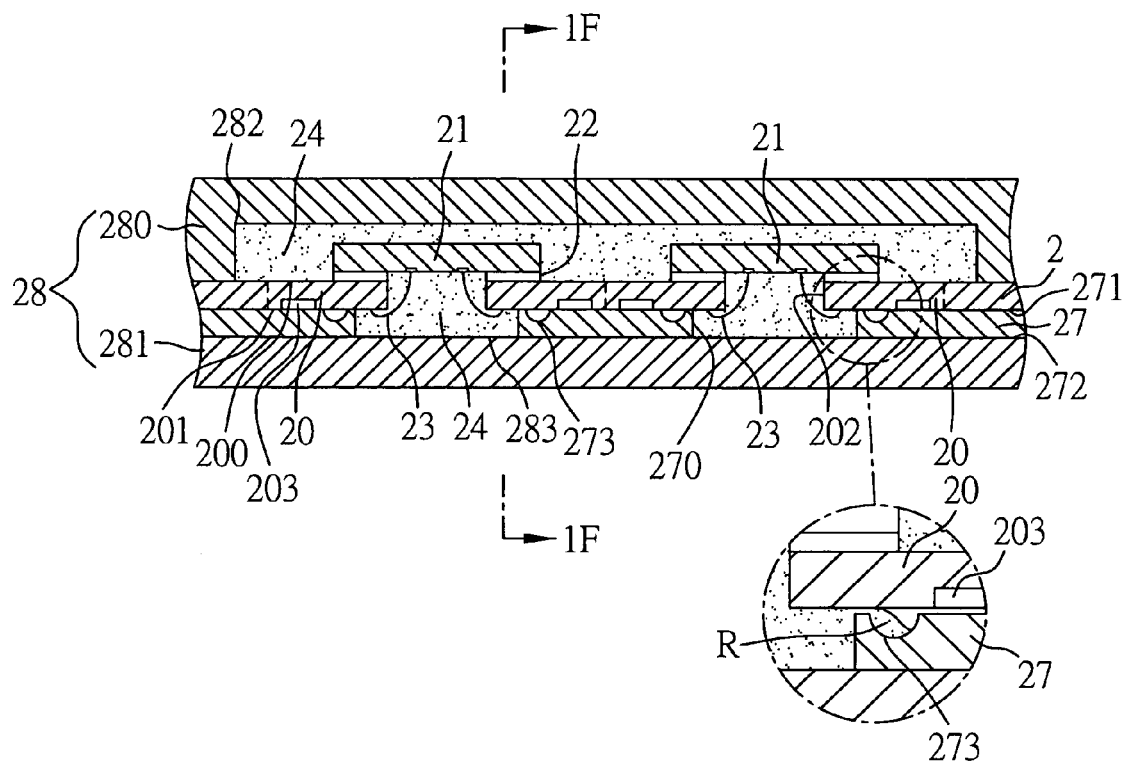
Figure 1F:
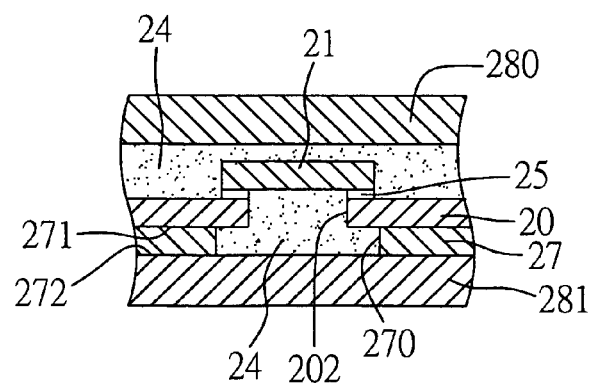

Referring to FIGS. 1E and 1F, thereafter, a molding process is performed and uses a conventional resin material (e.g. epoxy resin) to form an encapsulation body 24 on the upper and lower surfaces 200, 201 of the substrates 20. An encapsulation mold 28 having an upper mold 280 and a lower mold 281 is adopted, wherein the upper mold 280 is formed with a cavity 282 sized sufficiently to cover all of the substrates 20, and the lower mold 281 is a flat mold having a flat top surface 283 to be in contact with the spacer 27. For implementing the molding process, the chip-bonded and wire-bonded substrate plate 2 is disposed and clamped between the upper and lower molds 280, 281 of the encapsulation mold 28. The upper mold 280 abuts against the upper surfaces 200 of substrates 20, allowing all the chips 21 mounted on the substrates 20 to be received in the cavity 282 of the upper mold 280. The lower mold 281 comes into contact with the lower surface 272 of the spacer 27, allowing the spacer 27 to be interposed between the lower surfaces 201 of the substrates 20 and the top surface 283 of the lower mold 281, such that the bonding wires 23 reside in a combined cavity which is formed by the opening 202 of each of the substrates 20 and the corresponding through hole 270 of the spacer 27 and sealed by the lower mold 281. The resin material is injected into the cavity 282 of the upper mold 280 to fill the entire cavity 282 and encapsulate all of the chips 21 mounted on the substrates 20. The resin material also flows from the cavity 282 of the upper mold 280 through the gaps 25 between the chips 21 and the substrates 20 to the openings 202 of the substrates 20 and the through holes 270 of the spacer 27. The height of the gaps 25 as defined above is sufficient to permit smooth movement of the particles of the resin material through the gaps 25, such that the resin material can encapsulate the bonding wires 23 and fill each of the combined cavities formed by the openings 202 of the substrates 20 and the through holes 270 of the spacer 27, as well as fill the gaps 25 not applied with the adhesive 22 and formed along the shorter sides of the openings 202. When the resin material is cured, the encapsulation body 24 integrally formed on the upper and lower surfaces 200, 201 of the substrates 20 is fabricated, wherein the part of encapsulation body 24 on the upper surfaces 200 of the substrates 20 is a single body which encapsulates all of the chips 21, and the part of encapsulation body 24 on the lower surfaces 201 of the substrates 20 comprises a plurality of separate subunits each filling the combined cavity of the corresponding opening 202 and through hole 270 and filling the gaps 25 between the corresponding chip 21 and substrate 20 to encapsulate a corresponding set of bonding wires 23 received in the corresponding combined cavity. Since the thickness of the spacer 27 is larger than the height of wire loops of the bonding wires 23 protruding from the lower surfaces 201 of the substrates 20, the resin material filling the through holes 270 of the spacer 27 would completely encapsulate the bonding wires 23. Further, since the spacer 27 is made of a rigid material and the top surface 283 of the lower mold 281 is flat, the spacer 27 can be strongly clamped between the substrate plate 2 and the lower mold 281 and thereby helps prevent the resin material from flashing to the interface between the upper surface 271 of the spacer 27 and the lower surfaces 201 of the substrates 20 and over unintended area on the lower surfaces 201 of the substrates 20. Even in case of the resin material accidentally leaking or flashing through the interface between the spacer 27 and the substrates 20, the flash R of resin material would flow into the recessed portions 273 of the spacer 27 where the resin material is held without further flashing out of the recessed portions 273.

Figure 1G:
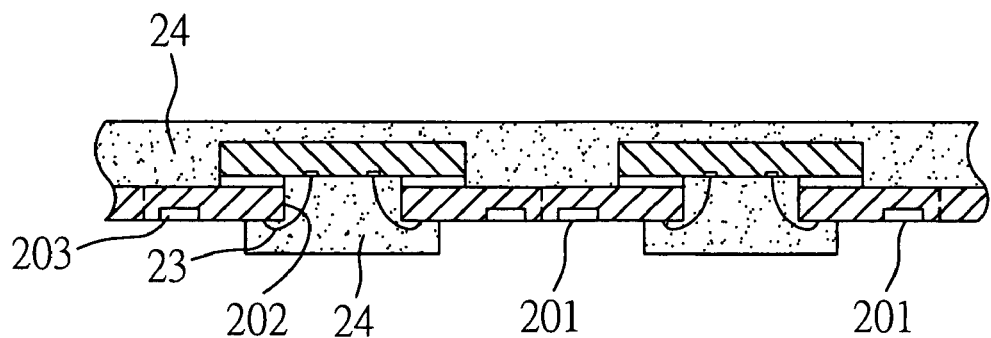

Referring to FIG. 1G, after the encapsulation body 24 is formed, the encapsulation mold 28 and the spacer 27 (FIGS. 1E and 1F) are removed from the substrates 20. Area on the lower surfaces 201 of the substrates 20, not covered by the encapsulation body 24, is exposed outside. Since the provision of the recessed portions 273 of the spacer 27, which are located between the array of ball pads 203 and the edge of the openings 202, effectively prevents the resin flash out of the recessed portions 273, the ball pads 203 on the lower surfaces 201 of the substrates 20 would not be contaminated by the resin flash and are exposed after removing the spacer 27 from the substrates 20. The exposed ball pads 203 are subject to a subsequent ball-implanting process. As described above, the bonding wires 23 received in the openings 202 of the substrate 20 and the through holes 270 of the spacer 27 are completely encapsulated by the encapsulation body 24 without being exposed.

Figure 1H:
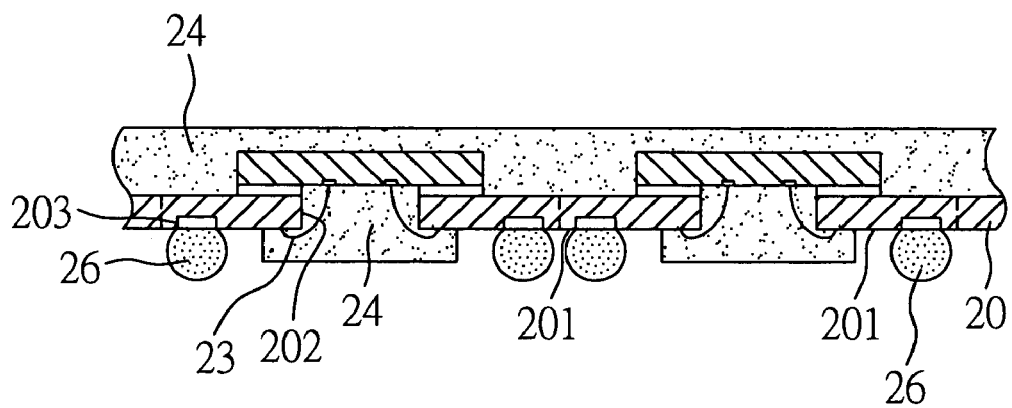

Referring to FIG. 1H, the ball-implanting process is implemented to form and bond a plurality of solder balls 26 to the exposed ball pads 203 on the lower surfaces 201 of the substrates 20.

Figure 1I:
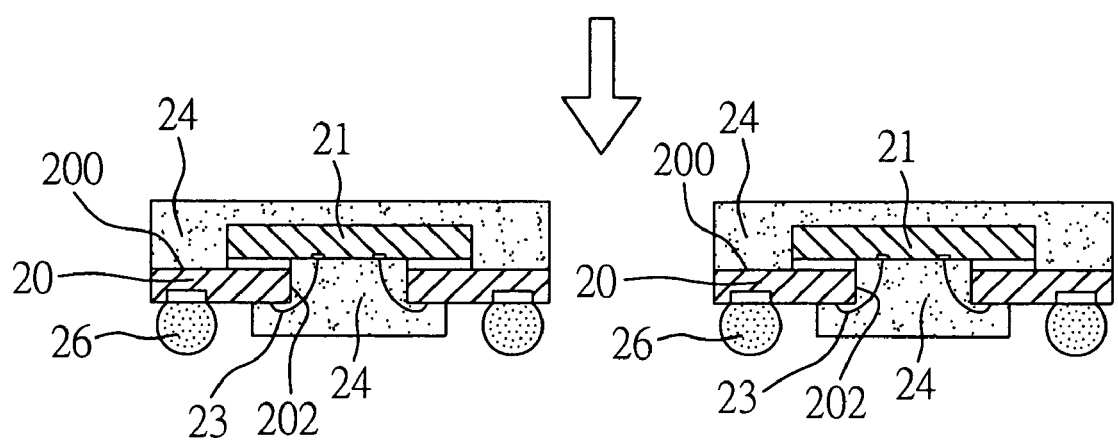
Figure 2A:
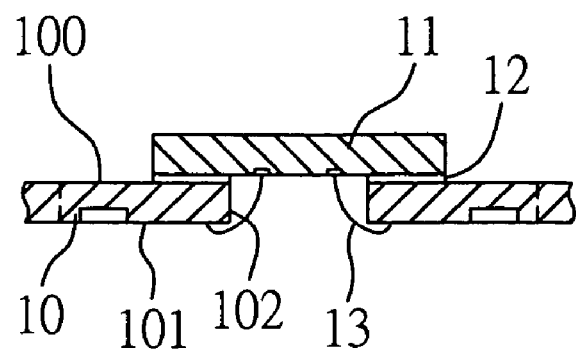
Figure 2B:
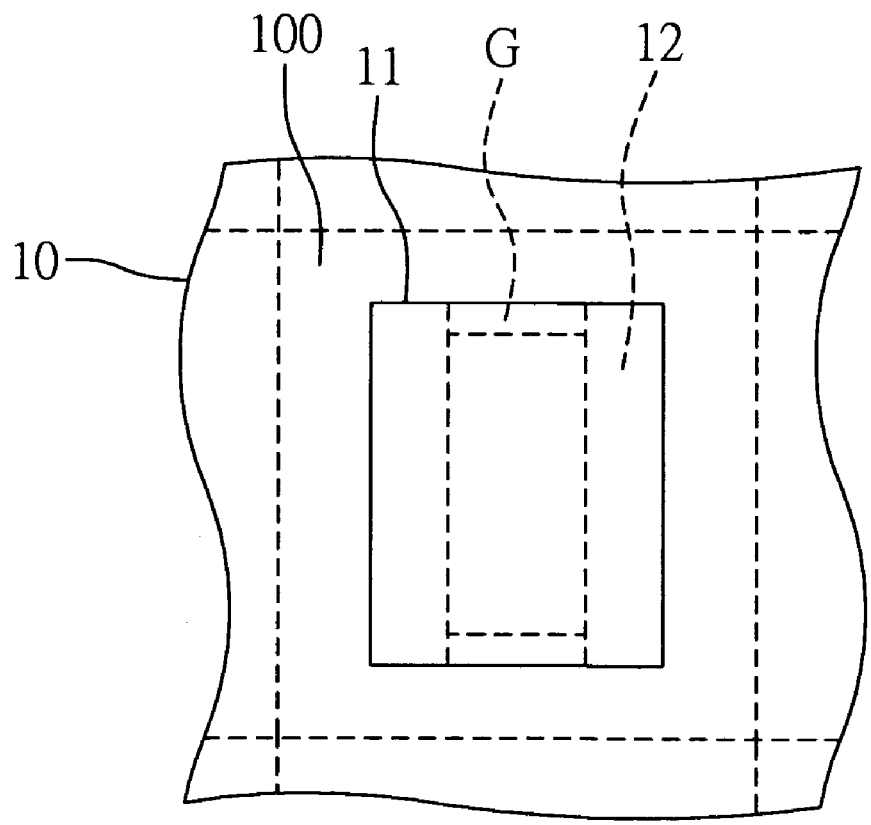
Figure 2C:
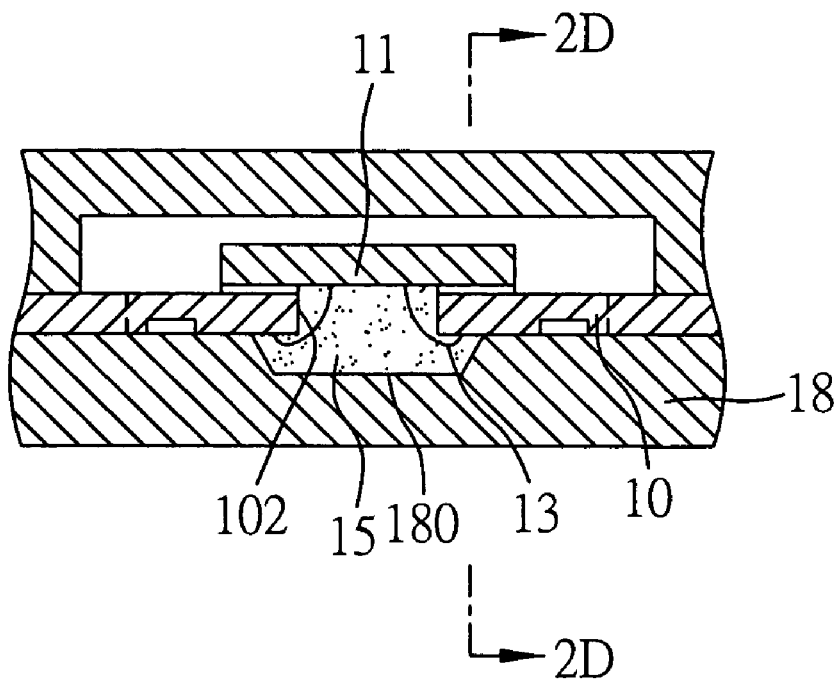
Figure 2D:
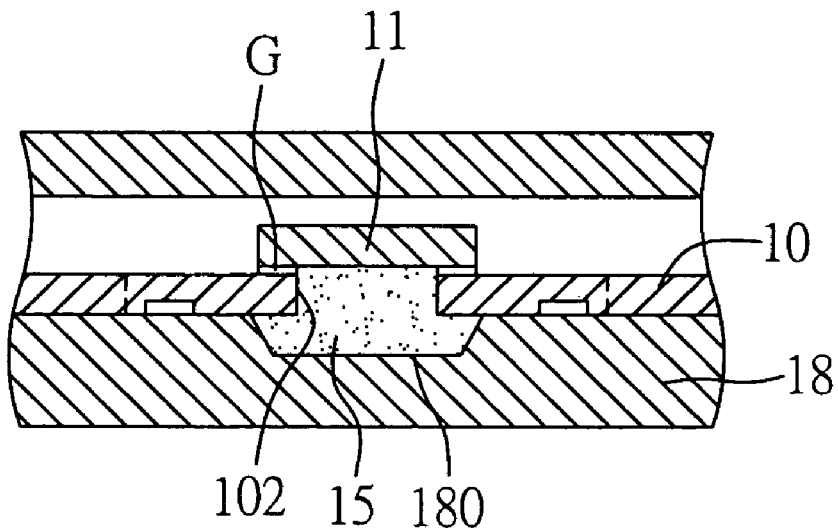
Figure 2E:
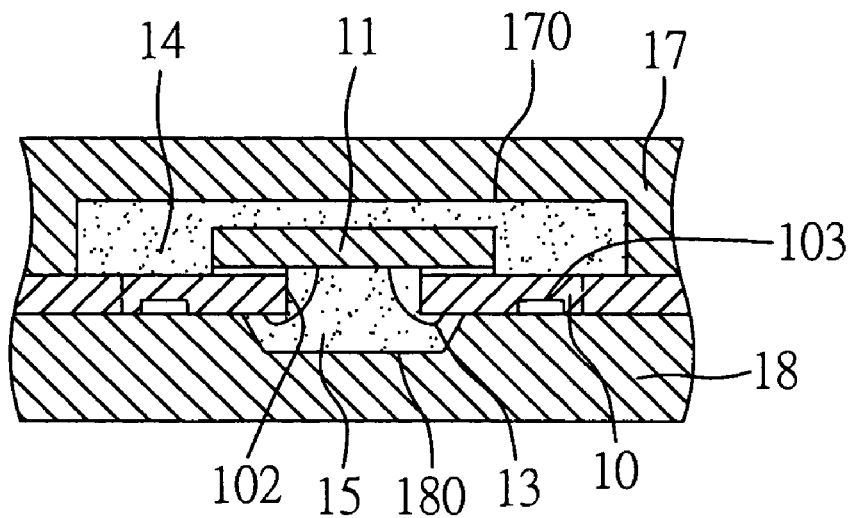
Figure 2F:
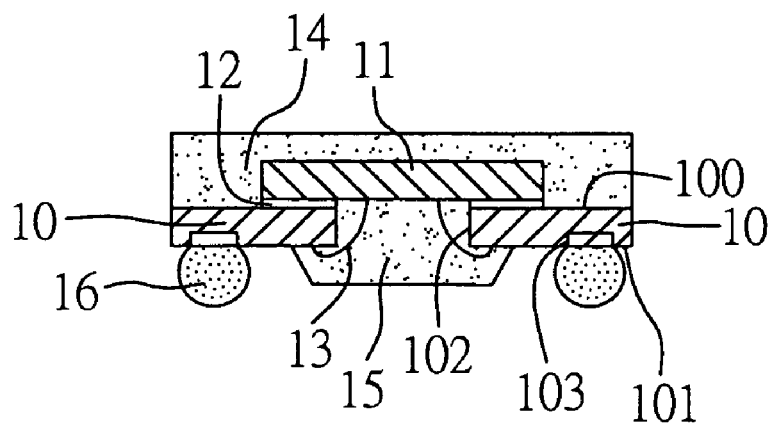
Figure 3:
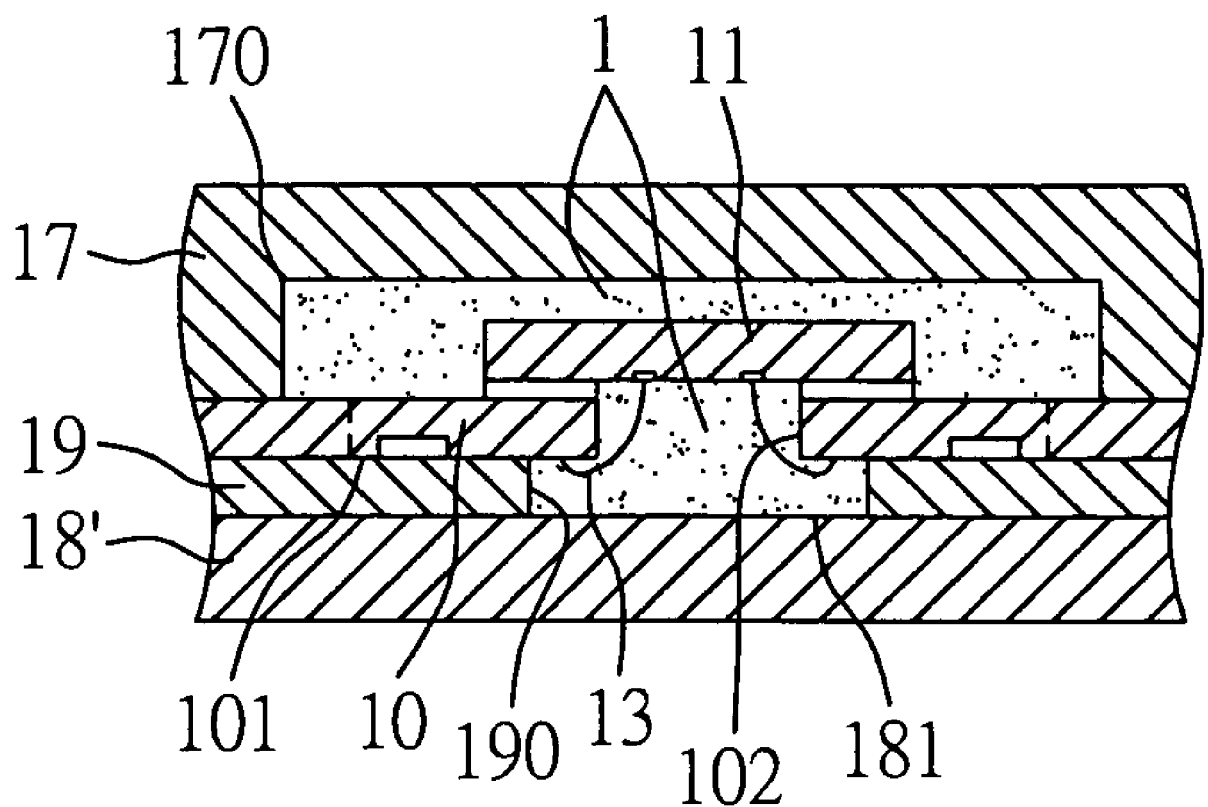
FIG. 3 (PRIOR ART) is a schematic diagram showing a procedural step of another fabrication method of a WBGA semiconductor package.

Referring to FIG. 1I, finally, a singulation process is performed to cut the part of encapsulation body 24 formed on the upper surfaces 200 of the substrates 20 and the substrate plate 2 to separate apart the integrally formed substrates 20 and thereby form a plurality of individual semiconductor packages each having a singulated substrate 20 and a plurality of solder balls 26. The solder balls 26 serve as input/output (I/O) connections to allow the chip 21 in each semiconductor package to be in electrical connection with an external device such as printed circuit board (not shown).

It is a characteristic feature of utilizing a spacer having through holes sized in accordance with openings of the substrates and formed with recessed portions respectively around the through holes. During molding, the spacer is strongly clamped between the substrate and the lower mold, with the recessed portions located between the ball pads on the substrate and the edge of the openings, and the gaps between the chips and substrates and along shorter sides of the substrate openings serve as passages for the resin material to form the encapsulation body on the substrates. Besides encapsulating the chips, the resin material flows through the gaps to encapsulate the bonding wires and fill the substrate openings, the through holes of the spacer and also the gaps. The strong clamping of the spacer helps prevent flash of the resin material to the interface between the spacer and the substrate. Once if the resin material accidentally leaks or flashes through the interface between the spacer and the substrate, it would be received and held in the recessed portions of the spacer without further flash or leakage out of the recessed portions. As a result, the ball pads on the substrate are free of contamination from resin flash and can be completely exposed for bonding the solder balls. Moreover, the spacer is cheaply fabricated, such that when using substrates having openings of different sizes, spacers formed with correspondingly-sized through holes can be used without significantly increasing the fabrication costs. As such, the flat lower mold having a flat top surface in contact with the spacer is universal for use with various substrates in accompany with appropriate spacers. Furthermore, the integral encapsulation body that encapsulates the chip and bonding wires can desirably enhance the mechanical strength of the semiconductor package.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for fabricating a window ball grid array (WBGA) semiconductor package, comprising the steps of:

preparing a substrate plate integrally formed of a plurality of substrates each of which has an upper surface and an opposite lower surface and has an opening formed through the same, wherein at least one array of ball pads are formed on the lower surface of each of the substrate around the opening and spaced apart from the edge of the opening;

mounting at least one chip on the upper surface and over the opening of each of the substrates via an adhesive, with gaps, not applied with the adhesive, being formed between the chips and the corresponding substrates;

forming a plurality of bonding wires through the opening of each of the substrates for electrically connecting the chip to the lower surface of the corresponding substrate;

preparing a spacer having an upper surface and an opposite lower surface and having a plurality of through holes through the same, with a recessed portion formed on the upper surface of the spacer around each of the through holes; and attaching the upper surface of the spacer to the lower surfaces of the substrates, wherein each of the through holes corresponds to and is larger than the opening of each of the substrate, and the recessed portion is located between the array of ball pads and the edge of the opening, and wherein the spacer has a thickness larger than a height of wire loops of the bonding wires protruding from the lower surfaces of the substrates so as to allow the bonding wires bonded to each of the chips to be received in the corresponding through hole of the spacer and the opening of the corresponding substrate;

performing a molding process which uses an upper mold having a cavity and a lower mold to form an encapsulation body by a resin material on the upper and lower surfaces of the substrates, wherein the upper mold is mounted on the upper surfaces of the substrates with the chips received in the cavity, and the lower mold is attached to the lower surface of the spacer with the spacer disposed between the substrates and the lower mold, so as to allow the resin material to fill the cavity for encapsulating the chips and flow through the gaps between the chips and the corresponding substrates for filling the openings of the substrates, the through holes of the spacer and the gaps and encapsulating the bonding wires;

removing the upper and lower molds and the spacer from the substrates;

bonding a plurality of solder balls to the ball pads on the lower surface of each of the substrates; and cutting part of the encapsulation body formed on the upper surfaces of the substrates and the substrate plate to separate apart the integrally formed substrates and form a plurality of individual semiconductor packages each having a singulated substrate.

2. The method of claim 1, wherein if the resin material leaks through an interface between the lower surfaces of the substrates and the upper surface of the spacer to reach the recessed portion of the spacer, the recessed portion holds the leaking resin material therein and prevents further leakage.

3. The method of claim 1, wherein part of the encapsulation body formed on the lowers surfaces of the substrates has a thickness smaller than a height of the solder balls.

4. The method of claim 1, wherein the chip has an active surface and an opposite inactive surface, and the active surface faces the opening of the corresponding substrate and is connected with the bonding wires, allowing the active surface to be entirely encapsulated by the adhesive and the encapsulation body.

5. The method of claim 1, wherein the chip has a surface area larger than the opening of the corresponding substrate and entirely covers the opening.

6. The method of claim 1, wherein the opening has a rectangular shape with two opposite longer sides and two opposite shorter sides.

7. The method of claim 6, wherein the gaps between the chip and the substrate are located along the two shorter sides of the opening.

8. The method of claim 1, wherein the gaps have a height equal to a thickness of the adhesive which is predetermined to allow particles of the resin material to pass through the gaps.

9. The method of claim 7, wherein the gaps have a height equal to a thickness of the adhesive which is predetermined to allow particles of the resin material to pass through the gaps.

10. The method of claim 1, wherein the lower mold has a flat surface in contact with the spacer.

11. The method of claim 1, wherein the spacer is made of a rigid material.

* * * * *